United States Patent [19]

Nagano

[11] Patent Number: 4,739,174

[45] Date of Patent: Apr. 19, 1988

[54] CONVERTING CIRCUIT HAVING FIRST AND SECOND OPTICALLY COUPLED PHOTOTRANSISTORS AND FIRST AND SECOND OPERATIONAL AMPLIFIERS

[75] Inventor: Katsumi Nagano, Shimonoseki, Japan

[73] Assignee: Kabushiki Kaisha Toshiba, Kawasaki, Japan

[21] Appl. No.: 655,229

[22] Filed: Sep. 27, 1984

[30] Foreign Application Priority Data

Sep. 30, 1983 [JP] Japan ................................ 58-182731

[51] Int. Cl.$^4$ .......................................... G02B 27/00
[52] U.S. Cl. ...................................... 250/551; 307/311
[58] Field of Search ........... 250/551, 208, 209, 214 R; 307/311

[56] References Cited

U.S. PATENT DOCUMENTS

| | | | |
|---|---|---|---|
| 3,893,037 | 7/1975 | Herbert | 330/59 |
| 3,913,001 | 10/1975 | Kayama | 250/551 |
| 3,975,643 | 8/1976 | Toth | 250/551 |
| 4,056,719 | 11/1977 | Waaben | 250/551 |
| 4,058,735 | 11/1977 | Tippner | 250/551 |
| 4,282,604 | 8/1981 | Jefferson | 307/311 |

FOREIGN PATENT DOCUMENTS 1435059 5/1976 United Kingdom .

OTHER PUBLICATIONS

Linear Integrated Networks, Fundamentals Van Nostrand Reinhold, p. 260, 1974.
Symons, "Small-Signal Opto-Electronic Transformer," Electronic Engineering, vol. 41, No. 501, pp. 35-39, Nov. 1969.

*Primary Examiner*—David C. Nelms
*Assistant Examiner*—William L. Oen
*Attorney, Agent, or Firm*—Finnegan, Henderson, Farabow, Garrett & Dunner

[57] ABSTRACT

There is provided a converting circuit which functions as a transformer for an electronic circuit by electrically isolating the input and output terminals by optically coupling the input circuit system and the output circuit system through photocouplers.

4 Claims, 9 Drawing Sheets

CONVERTING CIRCUIT HAVING FIRST AND SECOND OPTICALLY COUPLED PHOTOTRANSISTORS AND FIRST AND SECOND OPERATIONAL AMPLIFIERS

BACKGROUND OF THE INVENTION

The present invention relates to a converting circuit which produces a voltage and a current at an output terminal which are proportional to the voltage and current applied to the input terminals and, more particularly, to a converting circuit which is used as a transformer for converting an impedance.

The conventional definition of a transformer as a circuit element is shown, for example, in "Linear Integrated Networks, Fundamentals," by G. S. Moschytz, Van Nostrand Reinhold, 1974, page 260. However, a conventional electronic circuit when used as a transformer has a mutual relation between the voltages between the input and output terminals, but does not have the advantages of a transformer in that the input and the output are not electrically isolated, so that a sufficient function is not possible.

SUMMARY OF THE INVENTION

It is therefore an object of the present invention to provide a converting circuit which can electrically isolate the input and the output and which can function as a transformer for an electronic circuit.

According to one embodiment of the invention, there is provided a converting circuit comprising: a first terminal; a first voltage/current converter for converting a voltage applied to the first terminal to a first current corresponding to this voltage; a first electric/photoconverter for converting the first current output from the first voltage/current converter to an optical signal; a first photoelectric converter which is optically coupled to the first electric/photoconverter and obtains a current corresponding to the optical signal generated by the first electric/photoconverter; a resistor for converting an output current of the first photoelectric converter to a voltage corresponding thereto; a second terminal; a load element provided for the second terminal; a second voltage/current converter for applying the voltage generated by the resistor to the second terminal and for generating a second current which is set depending upon the load element provided for the second terminal; a second electric/photoconverter for converting the second current generated by the second voltage/current converter to an optical signal corresponding thereto; and a second photoelectric converter which is optically coupled to the second electric/photoconverter and supplies a current corresponding to the optical signal generated by the second electric/photoconverter to the first terminal.

With such an arrangement, the voltage proportional to the voltage applied to the first terminal is obtained from the second terminal, while the current proportional to the current flowing through the second terminal is derived from the first terminal. In addition, since the transmission and reception of the signal between the input circuit system and the output circuit system are performed by the light, the first and second terminals are electrically isolated and the function as a transformer can be realized by an electronic circuit.

DETAILED DESCRIPTION OF THE PREFERRED EMBODIMENTS

Figure 1:
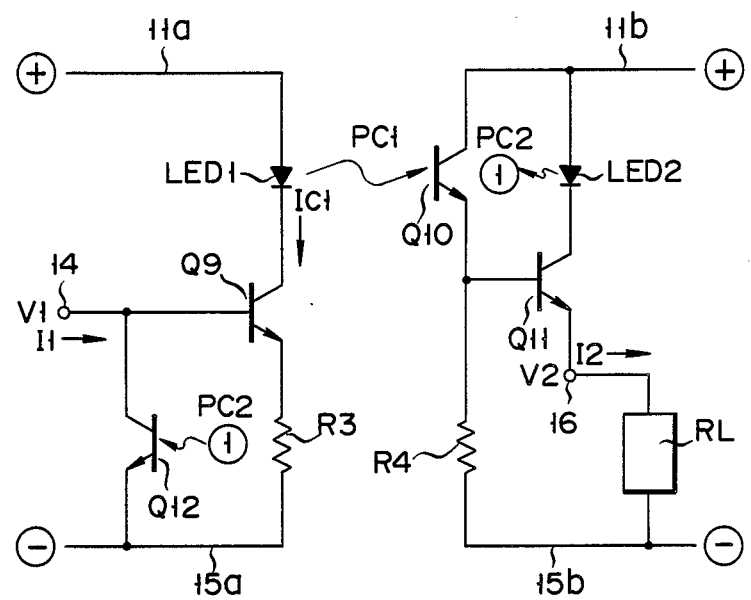
FIG. 1 is a circuit diagram showing a converting circuit according to one embodiment of the present invention.

FIG. 1 shows a converting circuit according to one embodiment of the present invention. An input terminal (first terminal) 14 is connected to the base of an npn-type transistor Q9 serving as first voltage/current converting means. The cathode of a light-emitting diode LED1 serving as first electric/photoconverting means is connected to the collector of the transistor Q9, while one end of a resistor R3 is connected to the emitter thereof, respectively. A positive power supply line 11a is connected to the anode of the light-emitting diode LED1, while a negative power supply line 15a is connected to the other end of the resistor R3. Also, a phototransistor Q10 is provided which is optically coupled to the light-emitting diode LED1 and serves as first photoelectric converting means (a photocoupler PC1 is constituted by the light-emitting diode LED1 and the phototransistor Q10). A positive power supply line 11a is connected to the collector of the phototransistor Q10, while one end of a resistor R4 is connected to the emitter thereof. A negative power supply line 15b is connected to the other end of the resistor R4. The base of an npn-type transistor Q11 serving as second voltage/current converting means is connected to the node of the emitter of the phototransistor Q10 and the resistor R4. The cathode of a light-emitting diode LED2 serving as second electric/photoconverting means is connected to the collector of the transistor Q11, while an output terminal (second terminal) 16 is connected to the emitter thereof, respectively. The positive power supply line 11b is connected to the anode of the light-emitting diode LED2. One end of a load element RL is connected to the output terminal 16. The negative power line 15b is connected to the other end of the load element RL. The collector and emitter of a phototransistor Q12, which is optically coupled to the light-emitting diode LED2 and serves as second photoelectric converting means, are connected between the input terminal 14 and the negative power supply line 15a. The light-emitting diode LED2 and the phototransistor Q12 constitute a photocoupler PC2.

The operation of the above-described circuit will be explained. When a voltage V1 is applied to the input terminal 14, the collector current $I_c1$ of the transistor Q9 will be $$I_c1 = (V1 - V_{BE})/R3 \quad (1)$$

and this current $I_c1$ becomes an input current of the photocoupler PC1. Assuming that a current transfer ratio of the photocoupler PC1 is K1, an output current of the transistor Q10 will be expressed by $K1 \cdot I_c1$. The conduction of the transistor Q11 is controlled on the basis of the value of which the above current was converted to the voltage by the resistor R4. Therefore, an output voltage V2 will be $$V2 = K1 \cdot R4(V1 - V_{BE})/R3 - V_{BE} \quad (2)$$
$$= K1 \cdot \frac{R4}{R3} V1 - \left(\frac{K1 \cdot R4}{R3} + 1\right) V_{BE}$$

When it is assumed that K1=1 and R4=R3 and that the voltage $V_{BE}$ between the base and the emitter of the transistor Q11 can be ignored, then V2=V1. Assuming that a common base current amplification factor of the transistor Q11 is 1, then the collector current of the transistor Q11 will be equal to an output current I2. Then, assuming that a current transfer ratio of the photocoupler PC2 is K2, then:

$$I1 = K2 \cdot I2 \quad (3)$$

Therefore, when the current transfer ratio K2 is 1, then I1=I2.

When a transformation ratio of a transformer is n, it is necessary that the relations shown in the following expression (4) be satisfied between the input voltage V1 and the output voltage V2, and between the input current I1 and the output current I2, respectively.

$$\left.\begin{array}{l} V1 = nV2 \\ I1 = \frac{1}{n} I2 \end{array}\right\} \quad (4)$$

Therefore, by setting the coefficients of the above-mentioned expressions (2) and (3) to be:

$$\frac{1}{K1 \cdot \frac{R4}{R3}} = n \quad (5)$$

$$K2 = \frac{1}{n}$$

on the basis of the above expression (4), the transformer having a transformation ratio of n can be realized by an electronic circuit. Namely, in the circuit of FIG. 1, a voltage ratio (V1/V2) can be set by a resistor value ratio (R3/R4), while a current ratio (I1/I2) can be freely set by the current transfer ratio K2 of the photocoupler PC2. In addition, since the input current I1 and the output current I2 respectively flow only in the direction indicated by the arrows shown in the diagram, this circuit is useful when a resistor is used as the load element RL.

With such an arrangement, since the signal transmission between the input and output sides is optically performed by the photocouplers PC1 and PC2, the potentials of the input circuit system and output circuit system can be completely separated. Therefore, for example, the power source voltage of the input circuit system can be set to 3 V and the power source voltage of the output circuit system can be set to 10 V.

Figure 2:
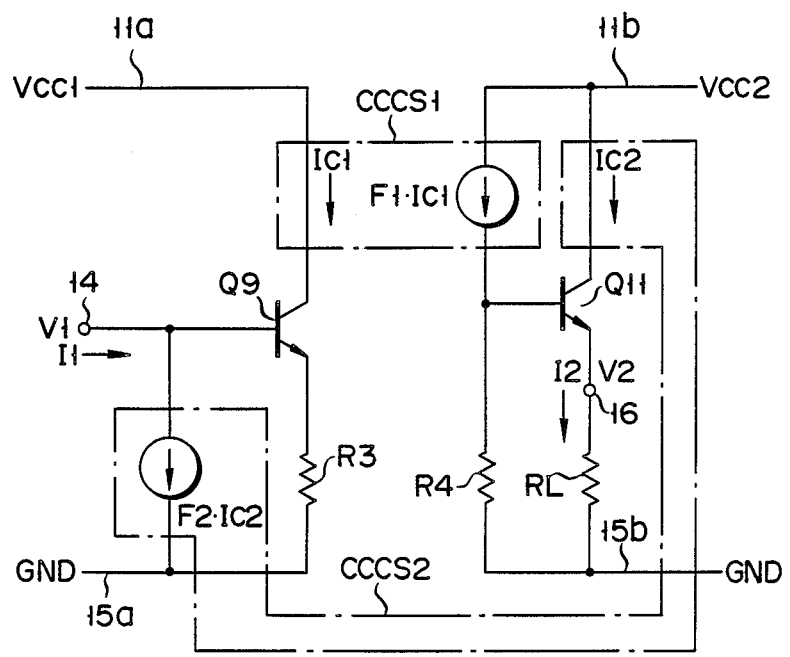
FIG. 2 is a circuit diagram showing a simulation circuit used to check the operation of the circuit of FIG. 1.
Figure 3:
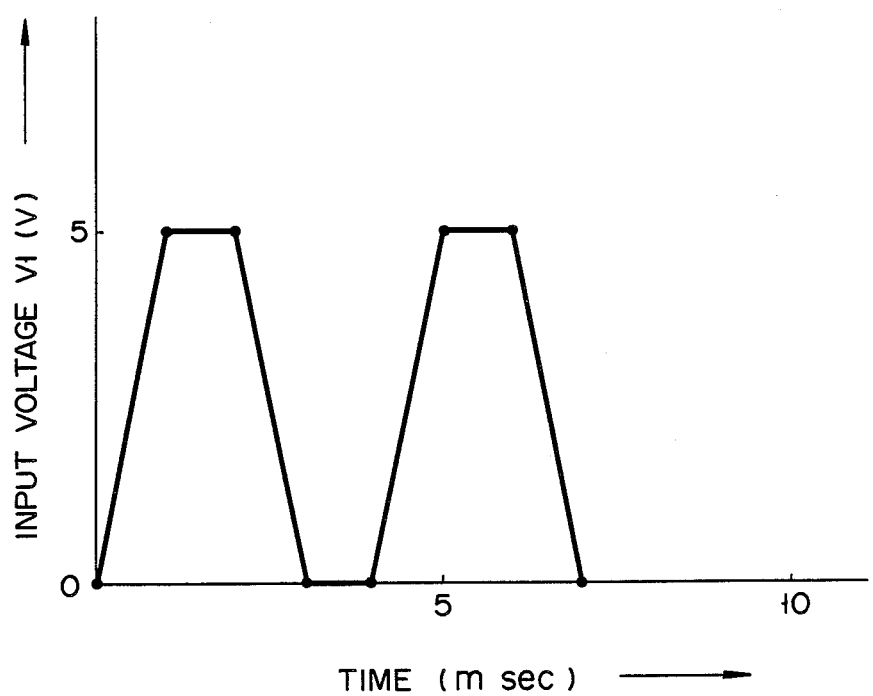
FIG. 3 is a waveform diagram showing the input waveform to the circuit of FIG. 2.
Figure 4:
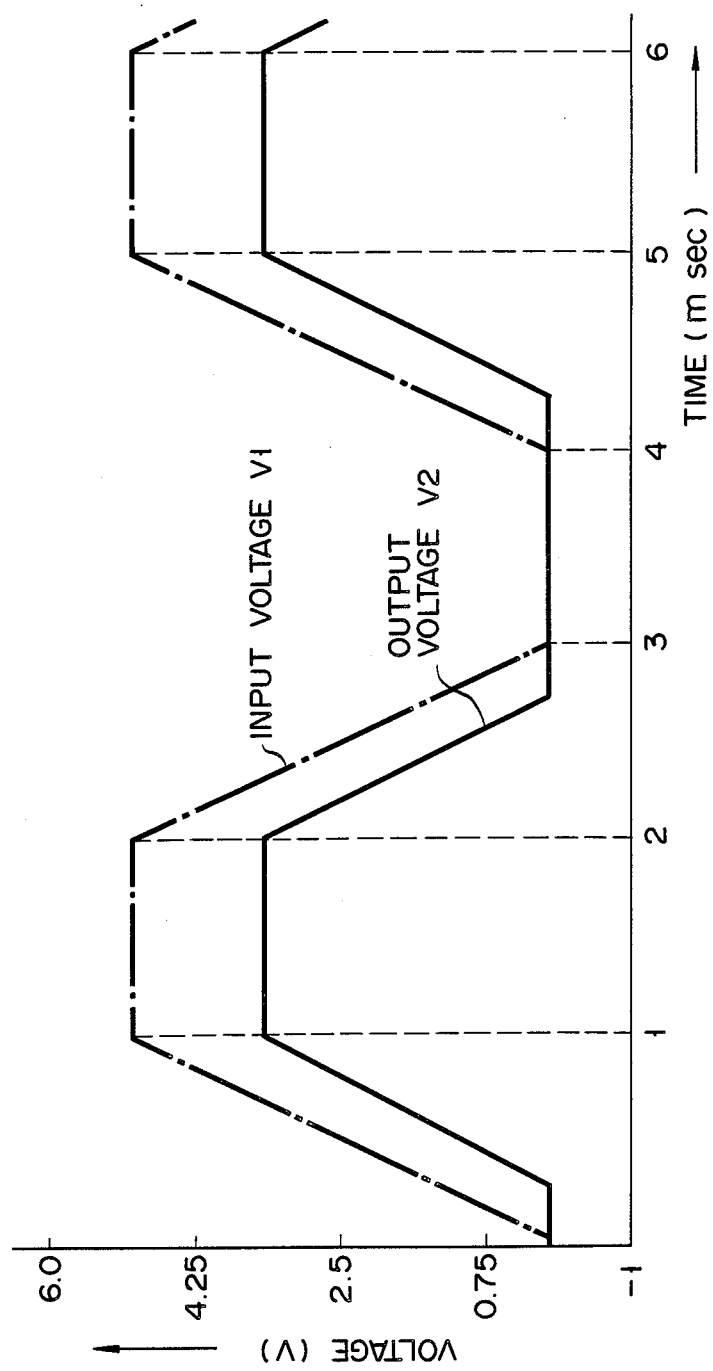
FIG. 4 is a waveform diagram for explaining the result of the simulation performed using the circuit of FIG. 2.

To check the fundamental operation of the circuit shown in FIG. 1, the simulation for operation was performed using a SPICE program. FIG. 2 shows a circuit diagram used in this simulation experiment. Portions of the photocouplers PC1 and PC2 in FIG. 1 are substituted with a current controlled current source (CCCS) in the simulation program. In FIG. 2, when the collector current $I_c1$ of the transistor Q9 is the input current, a CCCS1 can obtain the current of $F1 \cdot I_c1$ from the output side. On the other hand, when the collector current $I_c2$ of the transistor Q11 is the input current, a CCCS2 can obtain the current of $F2 \cdot I_c2$ from the output side, where, F1 and F2 are current gains and where $V_{cc}1=V_{cc}2=10$ V and R3=R4=RL=10 kΩ are set, respectively. The simulation was executed with respect to the case where a pulse-like voltage having an amplitude of 5 V and where smooth rising and falling edges as shown in FIG. 3 were applied to the circuit of FIG. 2. As a result, the relation between the input voltage V1 and the output voltage V2 as shown in FIG. 4 was obtained. Now, assuming that the current gains F1=F2=1, then:

$$\left.\begin{array}{l} V2 \simeq V1 - 2V_{BE} \\ I1 = I2 \end{array}\right\} \quad (6)$$

It will be obviously understood from the simulation result of FIG. 4 that the output voltage V2 is changed in association with a change in input voltage V1 although the output voltage V2 has a voltage error corresponding to $2V_{BE}$ (voltage drop due to the base-emitter voltage $V_{BE}$ of the transistors Q9 and Q11).

Figure 5:
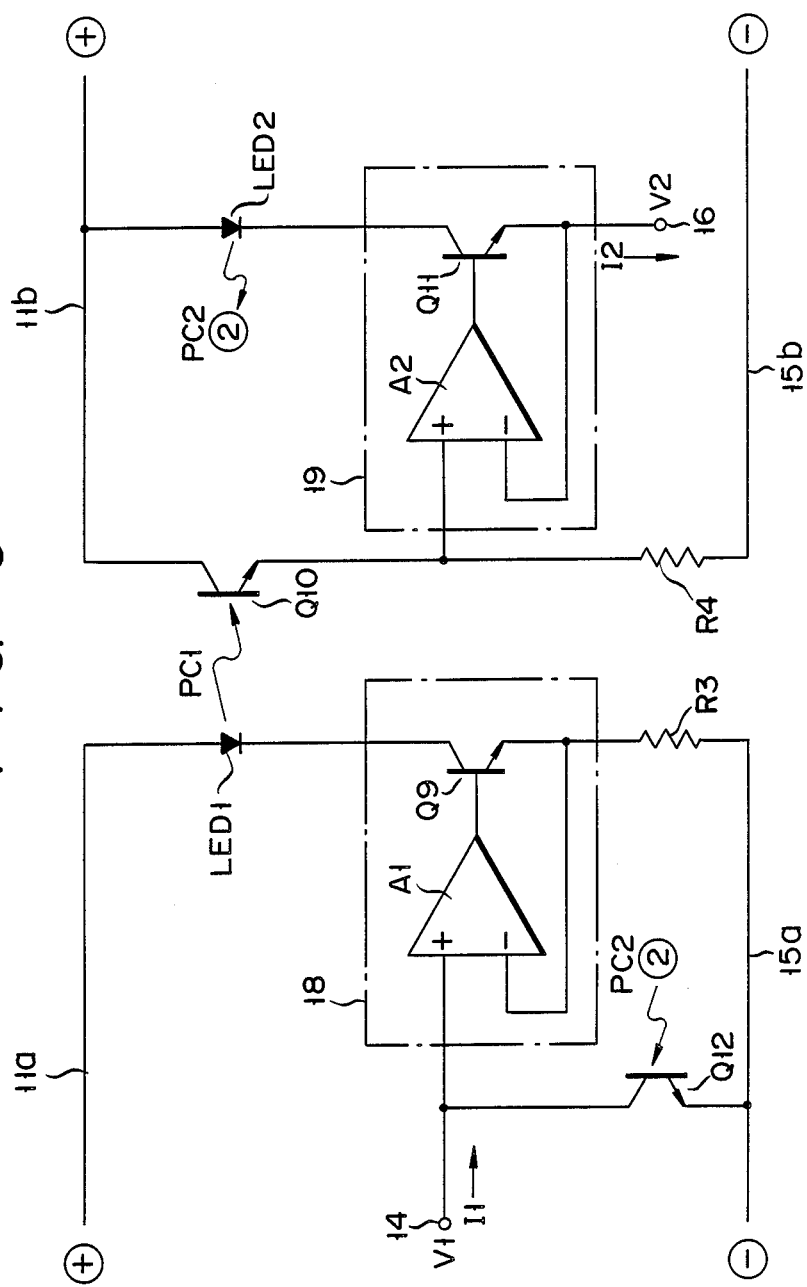
FIGS. 5 to 10 are circuit diagrams showing other embodiments of the invention, respectively.

FIG. 5 shows another embodiment of the invention. This circuit reduces the error in the output voltage V2 due to the base-emitter voltage $V_{BE}$ of the transistors Q9 and Q11 generated in the circuit of FIG. 1. In FIG. 5, the same components as those shown in FIG. 1 are designated by the same reference numerals, and their descriptions are omitted. Namely first and second voltage/current converters (voltage followers) 18 and 19 are respectively constituted by an operational amplifier A1 and the transistor Q9, and by an operational amplifier A2 and the transistor Q11. The input terminal 14 is connected to a non-inverting input terminal (+) of the operational amplifier A1. The emitter of the transistor Q9 is connected to an inverting input terminal (−) of the A1, and the base of the transistor Q9 is connected to an output terminal of the A1, respectively. On the other hand, the emitter of the photo transistor Q10 is connected to a non-inverting input terminal (+) of the operational amplifier A2. The emitter of the transistor Q11 is connected to an inverting input terminal (−) of the A2, and the base of the transistor Q11 is connected to an output terminal of the A2, respectively.

With such an arrangement, the conductions of the transistors Q9 and Q11 are respectively controlled by outputs of the operational amplifiers A1 and A2 using the potentials on the sides of the emitters thereof as references. Therefore, the base-emitter voltage $V_{BE}$ of the transistors Q9 and Q11 can be ignored and the error of the output voltage V2 is reduced, thereby enabling a high degree of accuracy to be obtained. Namely, the emitter potential of the transistor Q9 is nearly equal to the input voltage V1, and its error is only the input offset voltage of the operational amplifier A1. Thus, this makes it possible to accurately perform the voltage/current conversion by the resistors R3. The collector current of the transistor Q9 is converted to an optical signal by the light-emitting diode LED1. This optical signal is supplied to the phototransistor Q10 constituting the photocoupler PC1 together with the light-emitting diode LED1. Due to this, the current corresponding to the optical signal flows between the collector and the emitter of the phototransistor Q10, and the emitter current of the phototransistor Q10 is converted to the voltage by the resistor R4. The voltage generated across the resistor R4 is accurately transferred to the output terminal 16 by the voltage follower 19 constituted by the operational amplifier A2 and transistor Q11. At this time, the collector current of the transistor Q11 is converted to light by the light-emitting diode LED2, and the optical signal is supplied to the phototransistor Q12 which constitutes the photocoupler PC2 together with the light-emitting diode LED2. Due to this, the optical signal is converted to an electric signal, thereby allowing the current corresponding to the current flowing through the light-emitting diode LED2 to flow between the collector and the emitter of the phototransistor Q12. The input current I1 is shunted by this current; and the input current I1 and the output current I2 are controlled so as to be equal.

On the other hand, in the circuit of the simulation experiment shown in FIG. 2, since the CCCSs were used, linearity was present between the input terminal and the output terminal of the current source. However, when the photocoupler was used, no linearity is obtained in the region where the input current is small. This is because the light-emitting characteristic of the light-emitting diode is not linear in the region where the input current is small.

Figure 6:
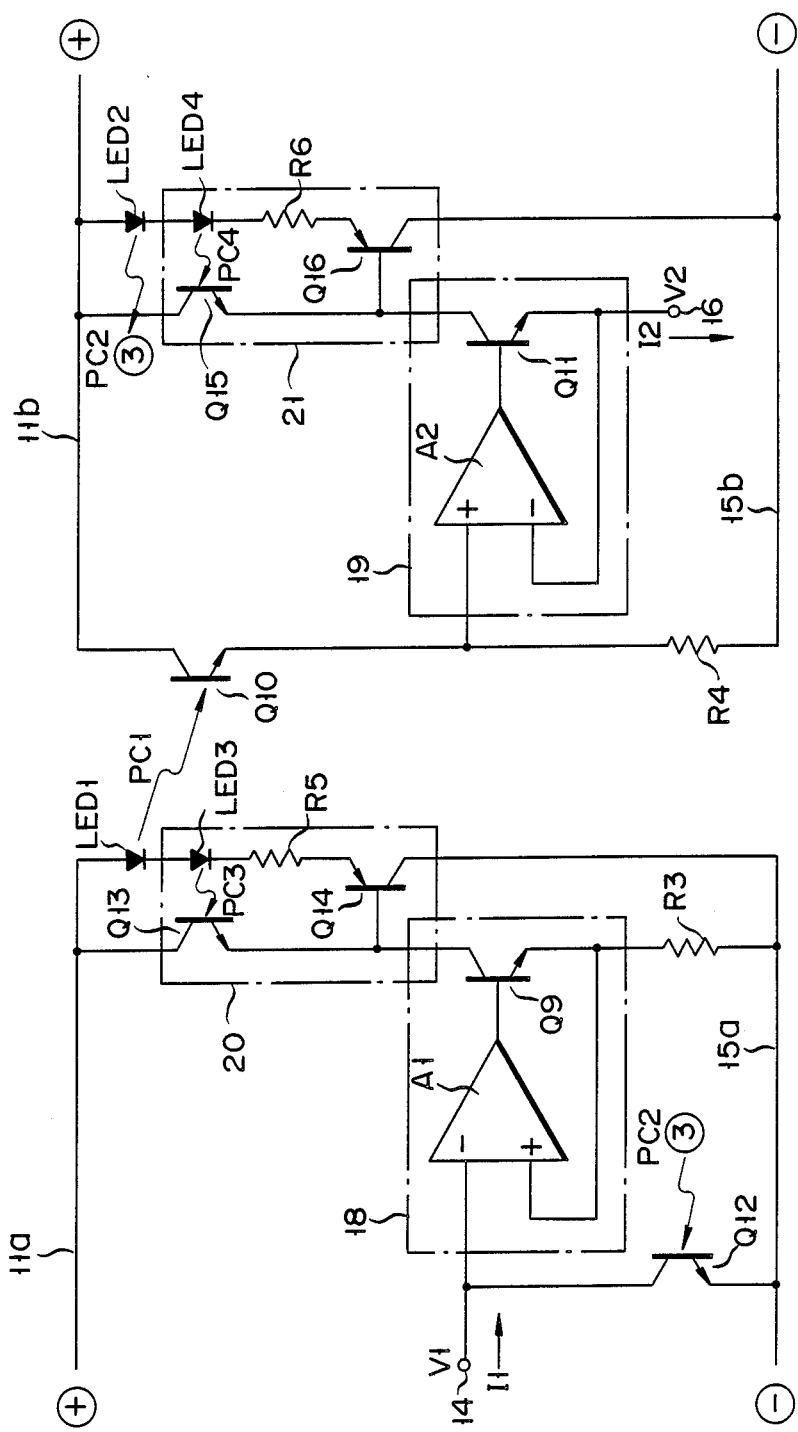

FIG. 6 shows a circuit in which the linearity of the photocouplers mentioned above is improved. Two photocouplers PC3 and PC4 for compensation of the characteristics are used in this circuit. In FIG. 6, the same parts and components as those shown in FIG. 5 are designated by the same reference numerals, and their descriptions are omitted. Namely, the emitter of a phototransistor Q13 of the photo coupler PC3 is connected to the collector of the transistor Q9. The positive power supply line 11a is connected to the collector of the phototransistor Q13. Also, the base of a pnp transistor Q14 is connected to the emitter of the phototransistor Q13. One end of a resistor R5 is connected to the emitter of the transistor Q14, while the negative power supply line 15a is connected to the collector thereof. The cathode of a light-emitting diode LED3 of the photocoupler PC3 is connected to the other end of the resistor R5. The cathode of the light-emitting diode LED1 is connected to the anode of the light-emitting diode LED3. The positive power supply line 11a is connected to the anode of the light-emitting diode LED1. The light-emitting diode LED3, phototransistor Q13 (photocoupler PC3), resistor R5, and transistor Q14 constitute a characteristic compensating circuit 20 of the light-emitting diode LED1. In addition, a characteristic compensating circuit 21 is also provided on the side of the collector of the transistor Q11. This circuit 21 consists of a light-emitting diode LED4, a phototransistor Q15 (the photocoupler PC4), a resistor R6, and the transistor Q16, and has a similar constitution as the characteristic compensating circuit 20.

In such an arrangement as mentioned above, if the current transfer coefficients of the photocouplers PC1 and PC3 are set to be equal, the output currents (emitter currents) of the phototransistors Q10 and Q13 will be equal. On the other hand, if the current transfer coefficients of the photocouplers PC2 and PC4 are set to be equal, the output currents (emitter currents) of the phototransistors Q12 and Q15 are set to be equal. This makes it possible to obtain the linearity of the light-emitting diodes LED1 and LED2 in the region of a small current. This characteristic compensation is disclosed in detail in Japanese Patent Application No. 56053/1983 by the same applicant.

Figure 7:
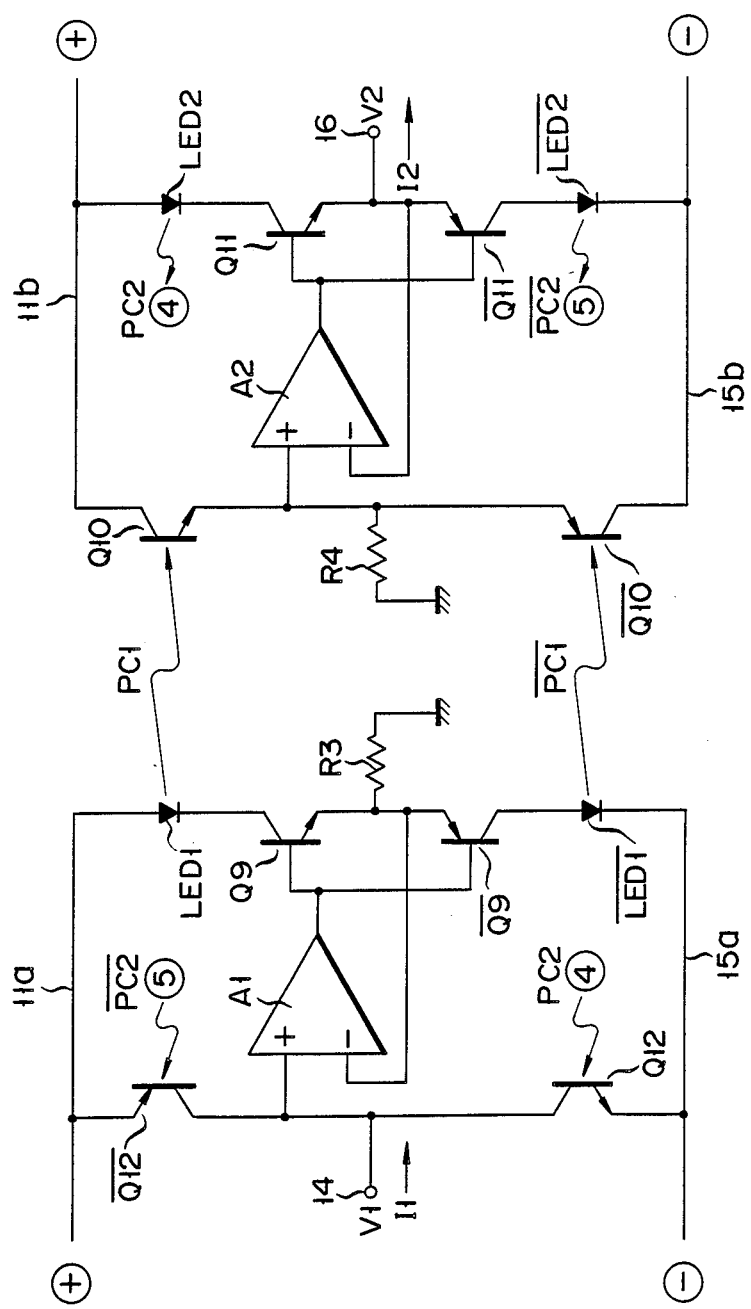

FIG. 7 shows still another embodiment of the invention in which the bipolar circuit is realized and in which the voltage and current are unipolar as has been described in the above-mentioned respective embodiments. This circuit is constructed by modifying the circuit of FIG. 5 so that it is a complementary type. In FIG. 7, the same parts and components as those shown in FIG. 6 are designated by the same reference numerals. The complementary circuit portions are designated by the same corresponding numerals with bars and so their descriptions are omitted.

With such an arrangement, the complementary circuit portions indicated by the reference numerals with bars are made operative by the voltages and currents of the opposite polarity. Therefore, according to this constitution, it is possible to constitute a converting circuit which functions as a transformer for an electronic circuit.

Figure 8:
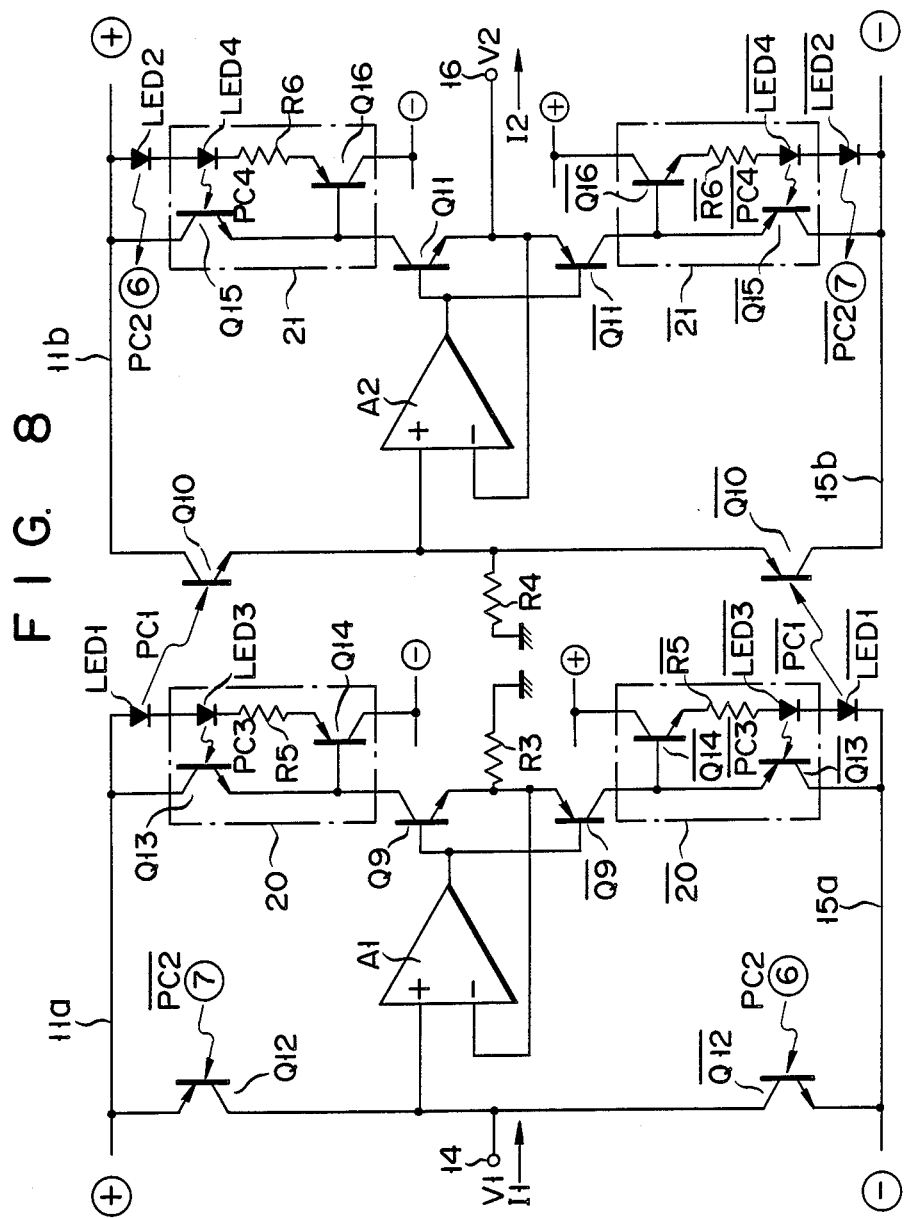

FIG. 8 shows another embodiment of the invention in which the characteristic compensating circuits 20 and 21 shown in FIG. 6 are provided in the circuit of FIG. 7. In FIG. 8, the same parts and components as those shown in FIGS. 7 and 6 are designated by the same reference numerals and their descriptions are omitted.

With such an arrangement, it is possible to construct a highly accurate converting circuit which functions as a transformer for an electronic circuit.

Figure 9:
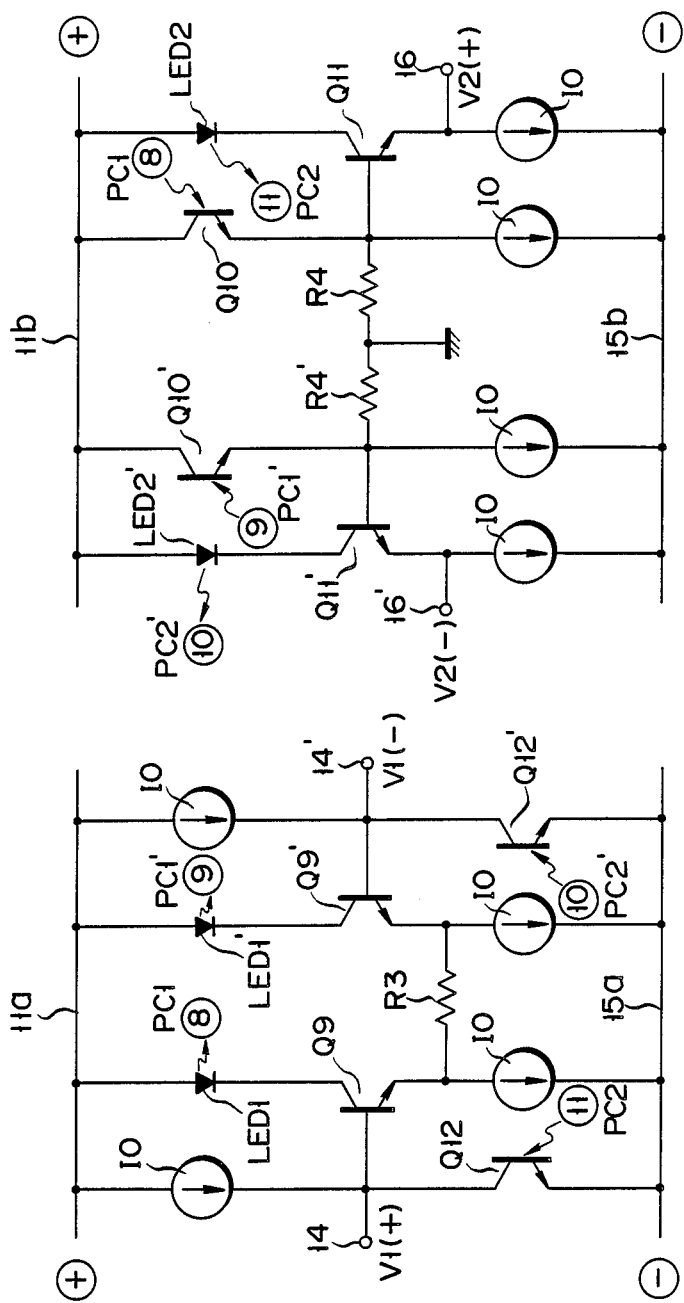

FIG. 9 shows still another embodiment of the invention. A transformer, one end of which is grounded, was implemented in the converting circuit shown in the above-mentioned respective embodiments. In contrast, this circuit uses a differential input terminal pair and a differential output terminal pair which are constituted as the floating types, thereby eliminating such a limitation. In other words, the circuit of FIG. 1 is constituted as the differential input type, and the bases of the transistors Q9 and Q9' are connected to the differential input terminals 14 and 14', respectively. The resistor R3 is connected between the emitters of the transistors Q9 and Q9', while the cathodes of the light-emitting diodes LED1 and LED1' are connected to the collectors of Q9 and Q9', respectively. The positive power supply line 11a is connected to the anodes of the light-emitting diodes LED1 and LED1'. Also, current sources IO and IO are respectively provided among the emitters of the transistors Q9 and Q9' and the negative power supply line 15a. The current sources IO and IO are respectively provided among the differential input terminals 14 and 14' and the positive power supply line 11a. The phototransistors Q10 and Q10' are provided so as to be optically coupled to the light-emitting diodes LED1 and LED1'. The resistors R4 and R4' are connected in series between the emitters of the phototransistors Q10 and Q10', while the positive power supply line 11b is respectively connected to the collectors of Q10 and Q10'. The ground is connected to the node of the resistors R4 and R4'. The bases of the transistors Q11 and Q11' are connected to the emitters of the phototransistors Q10 and Q10', respectively. The differential output terminals 16 and 16' are connected to the emitters of the transistors Q11 and Q11', while the cathodes of the light-emitting diodes LED2 and LED2' are connected to the collectors of Q11 and Q11', respectively. The positive power supply line 11b is connected to the anodes of the light-emitting diodes LED2 and LED2'. The current sources IO and IO are provided among the emitters of the transistors Q11 and Q11' and the negative power supply line 15b. The current sources IO and IO are provided among the bases of the transistors Q11 and Q11' and the negative power supply line 15b respectively. The phototransistors Q12 and Q12' are provided so as to be optically coupled to the light-emitting diodes LED2 and LED2'. The differential input terminals 14 and 14' are connected to the collectors of the phototransistors Q12 and Q12', respectively. The negative power supply line 15a is connected to the emitters of the Q12 and Q12'. The respective current sources IO, IO, ... are used to cancel the bias currents of the differential voltage/current converters, respectively.

With such an arrangement, when differential input voltages V1(+) and V1(−) are respectively applied to the differential input terminals 14 and 14', the output voltages V2(+) and V2(−) corresponding to the differential input voltages V1(+) and V1(−) are obtained from the differential output terminals 16 and 16'.

Therefore, with this embodiment, the limitation on the circuit design can be eliminated and the range of application can be enlarged.

Figure 10:
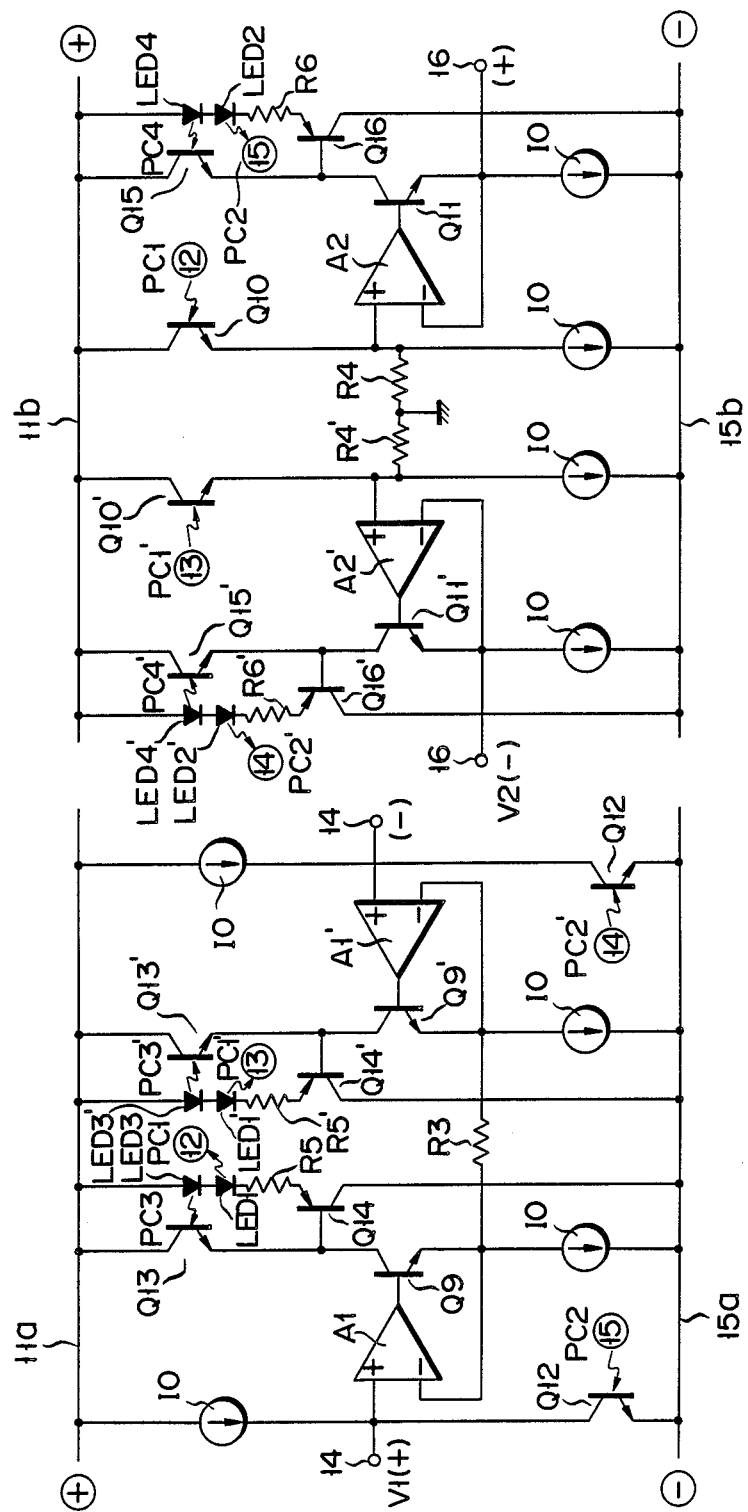

FIG. 10 shows still another embodiment of the invention. Namely, the characteristic compensating circuits 20 and 21 shown in FIG. 6 are provided in the circuit shown in FIG. 9, thereby realizing high accuracy. In FIG. 10, the same parts and components as those shown in FIGS. 9 and 6 are designated by the same reference numerals and their descriptions are omitted.

According to this embodiment, the limitations on the circuit design can be eliminated and a high accuracy can be also realized.

What is claimed is:

1. A converting circuit comprising:
  (a) a first terminal;
  (b) a first transistor whose conduction is controlled on the basis of the voltage applied to said first terminal;
  (c) a first negative power supply line;
  (d) a first resistor connected between the emitter of said first transistor and said first negative power supply line;
  (e) a first positive power supply line;
  (f) a first light-emitting diode whose anode is connected to said first positive power supply line and whose cathode is connected to the collector of said first transistor;
  (g) a first phototransistor which is optically coupled to said first light-emitting diode and obtains a current corresponding to the optical signal generated by said first light-emitting diode;
  (h) a second positive power supply line connected to the collector of said first phototransistor;
  (i) a second negative power supply line;
  (j) a second resistor connected between the emitter of said first phototransistor and said second negative power supply line;
  (k) a second terminal;
  (l) a load element connected between said second terminal and said second negative power supply line;
  (m) a second transistor whose conduction is controlled on the basis of the potential of the connection between said first photo transistor and said second resistor and whose emitter is connected to said second terminal;
  (n) a second light-emitting diode whose anode is connected to said second positive power supply line and cathode is connected to the collector of said second transistor;
  (o) a second phototransistor which is optically coupled to said second light-emitting diode, and shows collector is connected to said first terminal and emitter is connected to said first negative power supply line;
  (p) a first operational amplifier whose noninverted input terminal is connected to said first terminal, inverted input terminal is connected to the emitter of said first transistor, and output terminal is connected to the base of said first transistor; and
  (q) a second operational amplifier whose noninverted input terminal is connected to the connection between said first phototransistor and said second resistor, inverted input terminal is connected to the emitter of said second transistor, and output terminal is connected to the base of said second transistor.

2. A converting circuit according to claim 1, wherein said converting circuit is formed as a complementary circuit and functions as a transformer with primary and secondary coils wherein one end of said primary and secondary coils is grounded.

3. A converting circuit according to claim 1, wherein said converting circuit is formed as a differential input circuit and functions as a transformer.

4. A converting circuit according to claim 1, wherein said converting circuit further comprises:
  a third light-emitting diode whose anode is connected to the cathode of said first light-emitting diode and which has the same property as said first light-emitting diode;
  a third resistor whose one end is connected to the cathode of said third light-emitting diode;
  a third transistor which has a polarity opposite to said first transistor and whose emitter is connected to the other end of said third resistor, base is connected to the collector of said first transistor, and collector is connected to said first negative power supply line;
  a third photo transistor which is optically coupled to said third light-emitting diode and whose collector is connected to said first positive power supply line and emitter is connected to the collector of said first transistor;
  a fourth light-emitting diode whose anode is connected to the cathode of said second light-emitting diode and which has the same property as said second light-emitting diode;
  a fourth resistor whose one end is connected to the cathode of said fourth light-emitting diode;
  a fourth transistor having a polarity opposite to said second transistor, whose emitter is connected to the other end of said fourth resistor, base is connected to the collector of said second transistor, and collector is connected to said second negative power supply line; and
  a fourth phototransistor which is optically coupled to said fourth light-emitting diode, and whose collector is connected to said second positive power supply line and emitter is connected to the collector of said second transistor.

* * * * *